United States Patent
Son et al.

(10) Patent No.: US 9,793,463 B2
(45) Date of Patent: Oct. 17, 2017

(54) PIEZOELECTRIC VIBRATION MODULE

(71) Applicant: SAMSUNG ELECTRO-MECHANICS CO., LTD., Suwon-si (KR)

(72) Inventors: Yeon Ho Son, Suwon-si (KR); Jae Kyung Kim, Suwon-si (KR); Jun Kun Choi, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 606 days.

(21) Appl. No.: 14/227,263

(22) Filed: Mar. 27, 2014

(65) Prior Publication Data

US 2014/0292146 A1    Oct. 2, 2014

(30) Foreign Application Priority Data

Mar. 29, 2013   (KR) .................. 10-2013-0034735

(51) Int. Cl.
```
H01L 41/09    (2006.01)
H01L 41/047   (2006.01)
H01L 41/083   (2006.01)
```
(52) U.S. Cl.
CPC ...... H01L 41/0475 (2013.01); H01L 41/0906 (2013.01); H01L 41/083 (2013.01)

(58) Field of Classification Search
CPC .............. H01L 41/0475; H01L 41/0906; H01L 41/083
USPC .......... 310/323.01, 327, 338, 348, 363, 364, 310/365, 366
See application file for complete search history.

(56) References Cited

U.S. PATENT DOCUMENTS

| | | | |
|---|---|---|---|
| 7,385,337 B2* | 6/2008 | Mochizuki | H01L 41/0472 310/363 |
| 9,421,576 B2* | 8/2016 | Kim | G06F 3/041 |
| 2005/0062365 A1* | 3/2005 | Tanimoto | B32B 27/04 310/327 |

(Continued)

FOREIGN PATENT DOCUMENTS

| | | |
|---|---|---|
| CN | 101944435 A | 1/2011 |
| CN | 102857189 A | 1/2013 |

(Continued)

OTHER PUBLICATIONS

SIPO Office Action for Chinese Patent Application No. 201410126411.5 dated Jun. 16, 2017 which corresponds to the above referenced U.S. application.

*Primary Examiner* — Thomas Dougherty
*Assistant Examiner* — Karen B Addison
(74) *Attorney, Agent, or Firm* — LRK Patent Law Firm

(57) ABSTRACT

Disclosed herein is a piezoelectric vibration module capable of improving adhesion between a piezoelectric element and an external electrode disposed on the piezoelectric element, the piezoelectric vibration module, including: a piezoelectric element printing patterns of a first internal electrode and a second internal electrode therein and having a first external electrode electrically connected to the first internal electrode and a second external electrode electrically connected to the second internal electrode on an external surface thereof, wherein the first external electrode and the second external electrode are made of silver (Ag) and are formed on the external surface of the piezoelectric element.

12 Claims, 4 Drawing Sheets

(56) References Cited

U.S. PATENT DOCUMENTS

2015/0163598 A1* 6/2015 Abe ................ H04R 17/00
                                                                       310/327

FOREIGN PATENT DOCUMENTS

| KR | 10-2006-0000894 A | 1/2006 |
|----|-------------------|--------|
| KR | 10-1157868 B1     | 6/2012 |

* cited by examiner

PIEZOELECTRIC VIBRATION MODULE

CROSS REFERENCE TO RELATED APPLICATION

This application claims the benefit of Korean Patent Application No. 10-2013-0034735, filed on Mar. 29, 2013, entitled "Piezo Vibration Module", which is hereby incorporated by reference in its entirety into this application.

BACKGROUND OF THE INVENTION

1. Technical Field

The present invention relates to a piezoelectric vibration module.

2. Description of the Related Art

Generally, in a portable electronic device such as a portable phone, an e-book terminal, a game machine, a portable multimedia player (PMP), or the like, a vibration function has been utilized for various uses.

Particularly, a vibration generating apparatus for generating the vibration has been mainly mounted in the portable electronic device to thereby be used as an alert function that is a soundless receiving signal.

In accordance with multi-functionalization of the portable electronic device, miniaturization, integration, and multi-functionalization of the vibration generating apparatus have been currently demanded.

Further, in accordance with the recent demand of users for simple usage of the portable electronic device, a touch type device performing an input by touching the electronic device has been generally adopted.

A concept of a currently generally used haptic device widely includes a concept of reflecting intuitive experience of an interface user and diversifying feedback for a touch, in addition to a concept of performing an input through a touch.

The above-mentioned haptic device generally provides vibration by repeating compression and/or expansion deformation by external power applied to a piezoelectric element, where a vibration generator using the piezoelectric element has been disclosed in Patent Document 1.

The vibration generator disclosed in Patent Document 1, which generates the vibration using mechanical energy, includes an upper case, a lower case, a piezoelectric element arranged on an upper side of the lower case and vibrating when a voltage is applied thereto, an elastic unit formed on an upper side of the piezoelectric element, and a weight body (or a weight) elastically supported by the elastic unit.

The piezoelectric element is applied with a current from the outside through a printed circuit board and responses to the current passing through the piezoelectric element to thereby generate physical moment or displacement force, such that translation is generated in a vertical or horizontal direction.

However, the vibration generator disclosed in Patent Document 1 does not describe in detail for the piezoelectric element and a current application scheme. As is well-known to those skilled in the art, when the piezoelectric element receives an application signal from the printed circuit board, a phenomenon in which an external electrode of the piezoelectric element soldered to an end portion of the printed circuit board is delaminated from the piezoelectric element by a repetitive vibration motion is often generated.

As such, another method capable of improving adhesion between the piezoelectric element and the external electrode under a continuous vibration state should be considered.

PRIOR ART DOCUMENT

Patent Document (Patent Document 1) Patent Document 1: Korean Patent Laid-open Publication No. 10-2006-0000894

SUMMARY OF THE INVENTION

The present invention has been made in an effort to provide a piezoelectric vibration module capable of improving adhesion between a piezoelectric element and an external electrode formed on the piezoelectric element.

According to a preferred embodiment of the present invention, there is provided a piezoelectric vibration module, including: a piezoelectric element printing patterns of a first internal electrode and a second internal electrode therein and having a first external electrode electrically connected to the first internal electrode and a second external electrode electrically connected to the second internal electrode on an external surface thereof, wherein the first external electrode and the second external electrode may be made of silver (Ag) and may be formed on the external surface of the piezoelectric element.

The first external electrode and the second external electrode may additionally contain filler in silver (Ag).

The filler may be made of a metal selected from a group consisting of copper (Cu), palladium (Pd), and a combination thereof.

The piezoelectric vibration module may further include: the piezoelectric element generating vibration force by repeatedly performing expansion and compression deformation by external power applied thereto; an upper case opening a lower surface thereof and forming an internal space; a lower case coupled to the lower surface of the upper case to shield the internal space of the upper case; a vibration plate including a flat lower plate having the piezoelectric element mounted thereon and a pair of upper plates standing in a vertical upward direction at the center of both sides of the lower plate, and disposed in the upper case and the lower case to be vertically driven; and a flexible printed circuit board having one side end portion contacting the piezoelectric element and the other side end portion drawn to the outside of the piezoelectric vibration module.

The vibration plate may have a weight body additionally disposed between the pair of upper plates in order to increase the vibration force of the piezoelectric element.

The lower case and the lower plate may be spaced apart from each other by a predetermined interval so as not to affect a compression and/or expansion deformation of a piezoelectric element.

The piezoelectric vibration module may further include a first buffering member between the vibration plate and the upper case.

The piezoelectric vibration module may further include a third buffering member between the vibration plate and the lower case.

The piezoelectric vibration module may further include a second buffering member below both sides of the weight body.

The flexible printed circuit board (FPCB) may have terminals so as to apply power to the first and second external electrodes of the piezoelectric element.

The first external electrode and the second external electrode may be electrically connected to the respective terminals of the flexible printed circuit board through soldering parts.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
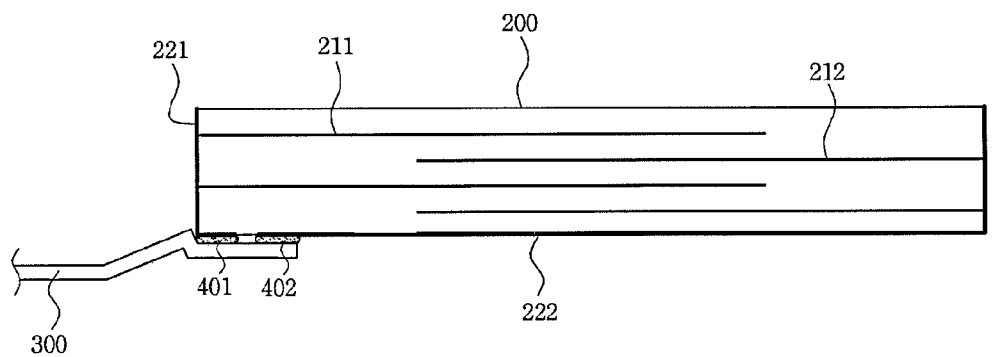
FIG. 1 is a view schematically showing a state of coupling a piezoelectric element and a flexible printed circuit board to a piezoelectric vibration module according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is a view schematically showing a state of coupling a piezoelectric element and a flexible printed circuit board to a piezoelectric vibration module according to a preferred embodiment of the present invention.

The piezoelectric vibration module according to the preferred embodiment of the present invention may generate the vibration by repeatedly performing a compression and/or expansion deformation of a piezoelectric element 200 according to an application of power supplied from a printed circuit board 300, preferably, a flexible printed circuit board 300 (hereinafter, referred to as FPCB).

Preferably, a piezoelectric vibration module 1 (see FIGS. 2 and 3) electrically communicates between external electrodes 221 and 222 of the piezoelectric element 200 and a terminal of the FPCB 300 by means of a solder and/or a conductive adhesive.

The piezoelectric element 200 is integrated as an element by alternately printing patterns of a first internal electrode 211 and a second internal electrode 212 designed in a desired form on thin molding sheets, laminating the respective sheet having the internal electrodes 211 and 212 printed thereon in a multi-layer shape, and then firing the lamination. The piezoelectric element 200 has a first external electrode 221 electrically connected to the first internal electrode 211 and a second external electrode 222 electrically connected to the second internal electrode 212 at end portions of both sides of an external surface of the piezoelectric element 200. The first external electrode 221 and the second external electrode 222 are electrically connected to each terminal of the FPCB 300 through soldering parts 401 and 402, for example, so as to be fixedly mounted. For reference, an end portion of one side of the FPCB 300 is received in the piezoelectric vibration module according to the preferred embodiment of the present invention so as to be connected to the first and second external electrodes 221 and 222 of the piezoelectric element 200 as described above, while an end portion of the other side of the FPCB 300 is drawn to the outside of the piezoelectric vibration module covered by an upper case and a lower case.

In addition, the piezoelectric element 200 may be configured to be laminated in a single-layer form or a multi-layer form. The piezoelectric element laminated in the multi-layer form may secure an electric field required to drive the piezoelectric element even at a low external voltage. Therefore, since an effect capable of decreasing a driving voltage of the piezoelectric vibration module according to the preferred embodiment of the present invention may be obtained, it is preferable in the present invention that the piezoelectric element 200 laminated in the multi-layer form is used.

In addition, the piezoelectric element 200 should be manufactured in the multi-layer form having a predetermined thickness so as to coincide with an oscillating frequency required by a user while decreasing a height of the piezoelectric vibration module.

Typically, the first external electrode 221 and the second external electrode 222 are formed by disposing them on the external surface of the piezoelectric element 200 so as to be separated from each other and then applying or depositing conductive paste of silver (Ag) material using an electrode thin film forming process, for example, a dipping scheme, a silk printing scheme, or a sputtering scheme.

In the case in which the compression and expansion deformation of the piezoelectric element 200 is repeated, the first and second external electrodes 221 and 222 applied onto the external surface of the piezoelectric element 200 according to the preferred embodiment of the present invention are often delaminated from the piezoelectric element 200 at the time of an unexpected falling impact or due to a difference in a coefficient of thermal expansion between the piezoelectric 200 and the external electrodes 221 and 222 during the driving through the compression and expansion deformation of about millions of times.

In order to assure conductivity for the first and second external electrodes 221 and 222 interposed between the piezoelectric element 200 and the FPCB 300, the present invention uses paste of pure silver (Ag) for the first and second external electrodes 221 and 222, where the paste of silver material is used by sintering to 690° C. to 750° C.

Preferably, the present invention additionally includes filler capable of increasing adhesion to the first and second external electrodes 221 and 222 made of pure silver (Ag) in order to improve the adhesion between the piezoelectric element 200 and the external electrode 222 formed on the external surface of the piezoelectric element 200.

Particularly, the filler for the external electrodes 221 and 222, which is a metal selected from a group consisting of copper (Cu), palladium (Pd), and a combination thereof, is additionally contained in pure silver (Ag) so as to be used. The external electrodes 221 and 222 containing the filler maintains conductivity and improves adhesion to the piezoelectric element 200 as described above, thereby making it possible to significantly decrease a delamination phenomenon as compared to an existing external electrode manufactured only by silver (Ag)

The metal selected from the group consisting of copper, palladium, and the combination thereof to be added in the silver material exhibits characteristics resistant to stress impact or thermal impact while not affecting piezoelectric characteristic of the piezoelectric element 200. This may improve an attachment state between the piezoelectric element and the external electrode.

Figure 2:
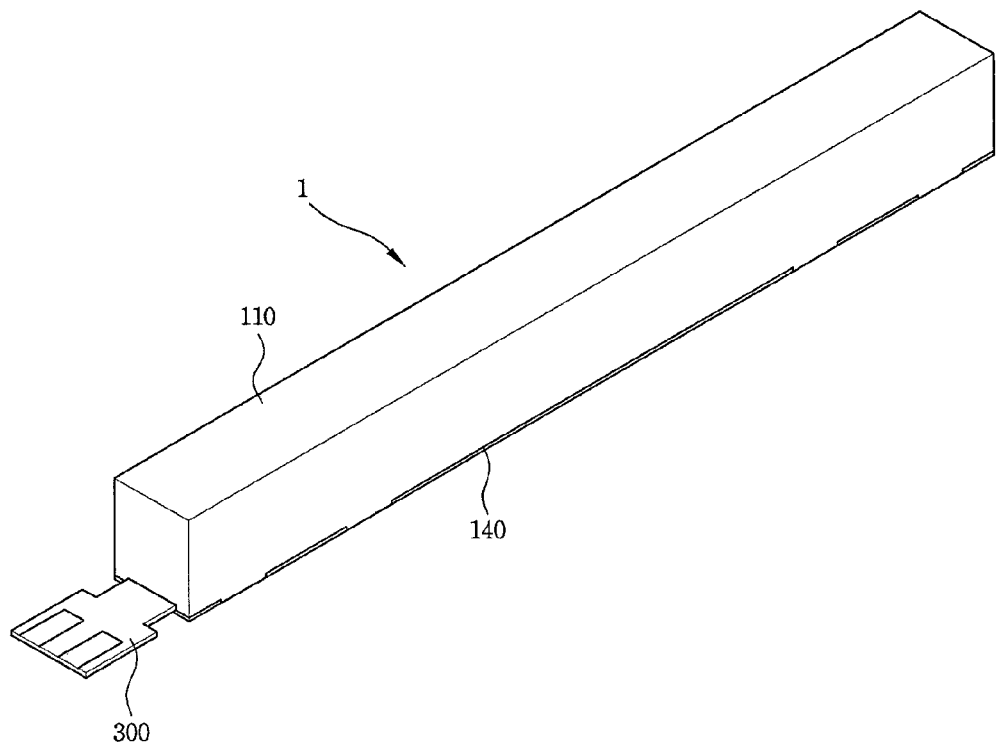
FIG. 2 is a perspective view of the piezoelectric vibration module according to the preferred embodiment of the present invention.
Figure 3:
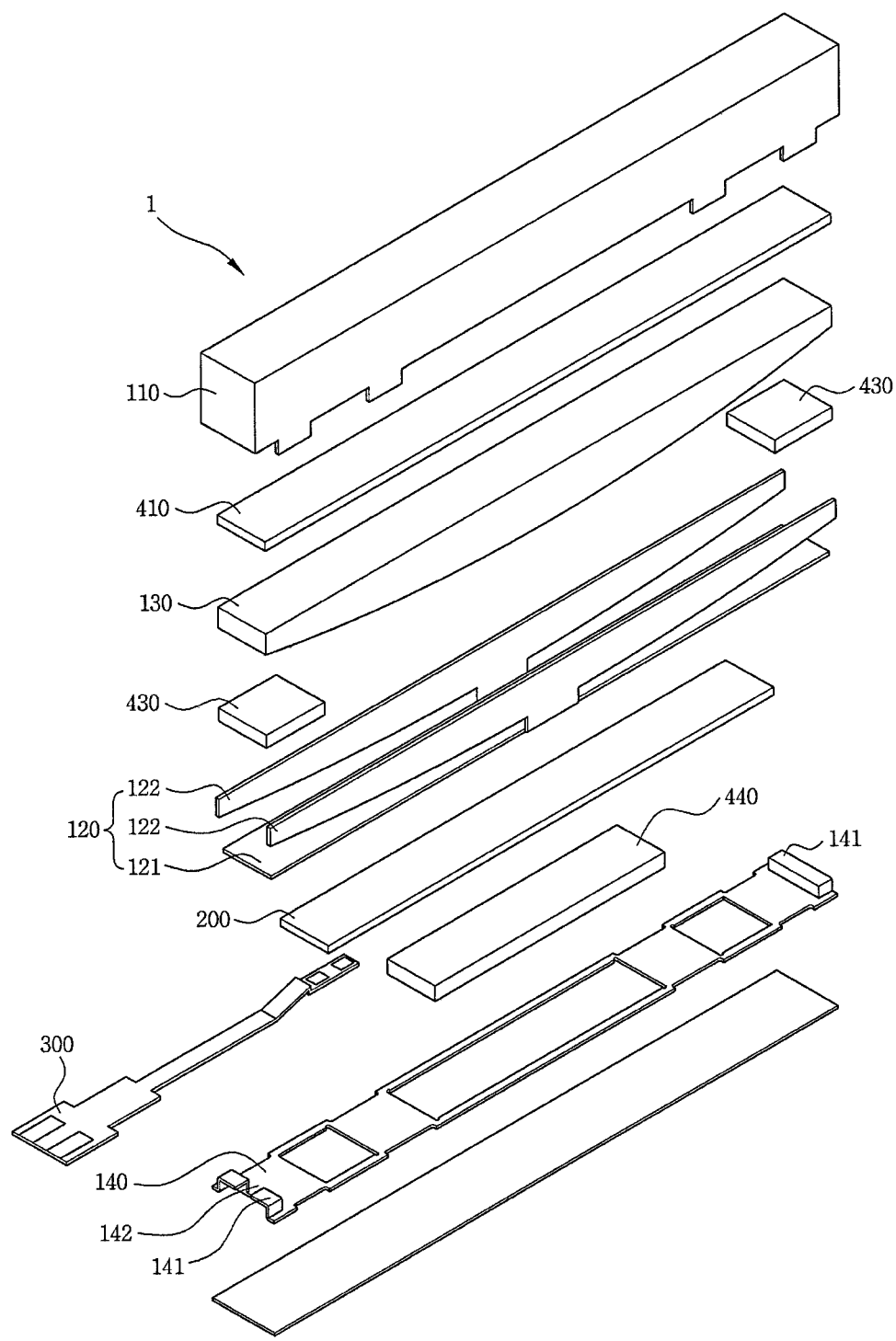
FIG. 3 is an exploded perspective view of the piezoelectric vibration module shown in FIG. 2.
Figure 4:
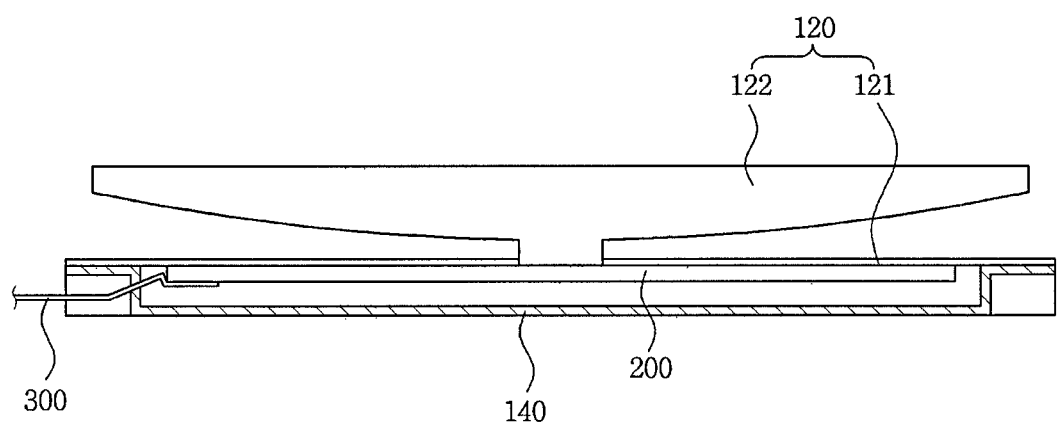
FIG. 4 is a cross-sectional view of the piezoelectric vibration module shown in FIG. 2.
Figure 5:
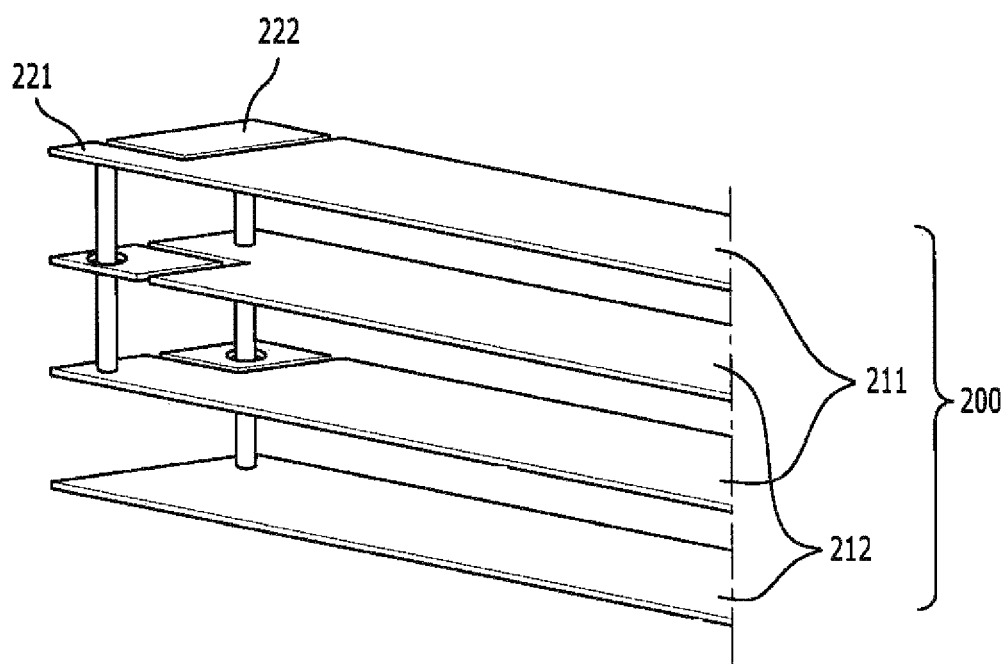
FIG. 5 is a view of the piezoelectric element which includes printed patterns of a first internal electrode and a second internal electrode.

Referring to FIGS. 2 to 4, the piezoelectric vibration module 1 according to the preferred embodiment of the present invention is configured of an upper case 110, a vibration plate 120, a weight body 130, and a lower case 140, where the piezoelectric vibration module 1 may be used as a unit for delivering vibration force to a touch screen panel (not shown), for example. Here, FIG. 4 shows a state in which the upper case and the respective buffering members are excluded so that an arrangement state between the respective configuration members of the piezoelectric vibration module according to the preferred embodiment of the present invention may be confirmed.

The upper case 110 may have a box shape in which it has an opened one side and receives a driving body, in other words, the vibration plate 120 attached with the piezoelectric element 200 in an internal space thereof.

The vibration plate 120 delivers the vibration force of the piezoelectric element 200 to an external component by a bending operation through the repetition of the expansion and compression deformation integrally with the piezoelectric element 200 and includes a flat lower plate 121. The lower plate 121 includes the piezoelectric element 200 mounted on a flat one surface thereof (specifically, a lower surface) and includes the weight body 130 disposed on the other surface thereof (specifically, an upper surface). The vibration plate 120 is mounted with the flexible printed circuit board 300 (hereinafter, referred to as FPCB) applying power for driving the piezoelectric device 200.

Particularly, the vibration plate 120 is made of a metal material having elastic force, for example, SUS, so that it may be deformed integrally with the piezoelectric element 200 that is repeatedly expansion and compression-deformed by application of the external power from the FPCB 300. Further, in order to prevent a bending phenomenon that may be generated due to hardening of a bonding member in advance in the case in which the vibration plate 120 and the piezoelectric element 200 are coupled to each other only in a bonding-coupling scheme, the vibration plate 120 may be made of invar, which is a material having a thermal expansion coefficient similar to that of the piezoelectric element.

As described above, the vibration plate 120 is made of the invar material having a thermal expansion coefficient similar to that of the piezoelectric element 200. Therefore, since thermal stress generated in the piezoelectric element 200 at the time of operation or thermal impact under a high temperature external environment is decreased, a piezoelectric deterioration phenomenon that electrical characteristics are deteriorated may be prevented.

Optionally, the vibration plate 120 may include a pair of upper plates 122 standing at both sides of the lower plate 121 in a vertical upward direction, in addition to the flat lower plate 121 as shown. The upper plate 122 is fixed to a central portion of the lower plate 121. The lower plate 121 and the upper plate 122 may be formed of an integral single component or be fixedly coupled to each other in various bonding schemes.

The pair of upper plates 122 may be disposed to be in parallel with each other by, for example, a width of the lower plate 121 and have the weight body 130 disposed therebetween. The weight body 130, which is a medium increasing the vibration force as much as possible, is formed to be inclined upwardly from a central portion thereof toward both end portions thereof in order to prevent a contact with the lower plate 121 of the vibration plate 120. Therefore, the upper plate 122 are also formed to be inclined upwardly from a central portion thereof to both end portions thereof, similar to the side shape of the weight body 130.

As described above, in the structure in which the vibration plate 120 includes the upper plate 122, since the weight body 130 does not contact the lower plate 121, the piezoelectric element 200 may also be disposed on a flat one surface of the lower plate 121.

For reference, the weight body 130 may be made of a metal material, preferably, a tungsten material having relatively high density in the same volume.

The lower case 140 is formed of a plate having a generally thin long flat shape as shown and is formed to have a size and a shape in which it may close an opened lower surface of the upper case 110.

The upper case 110 and the lower case 140 may be coupled to each other in various schemes such as a caulking scheme, a welding scheme, a bonding scheme, or the like, well-known to those skilled in the art.

In the case in which the power is applied to the piezoelectric element 200, the piezoelectric element 200 is completely attached to the lower plate 121, moment is generated at the center portion of the lower plate 121 by the expansion or compression deformation. Since the moment is generated in the state in which the lower plate 121 is fixed to both end portions of the lower case 140, the center portion of the vibration plate 120 is deformed in a vertical direction.

Even in the case in which the vibration plate 120 is vibrated in the vertical direction as described above, the vibration plate 120 should be spaced apart from the upper case 110 and the lower case 140 in parallel by a predetermined interval in order to prevent contact with the upper case 110 and the lower case 140.

Particularly, the piezoelectric vibration module 1 according to the preferred embodiment of the present invention forms coupling ends 141 protruded in a vertical-upward direction at both end portions of the lower case 140. Two coupling ends 141 support both end portions at the lower plate 121 of the vibration plate 120, such that the lower case 140 and the piezoelectric element 200 are spaced apart from each other. The flat lower plate 121 is seated on the coupling ends 141 formed on both end portions of the lower case 140 and spaces between the lower plate 121 of the vibration plate 120 and the lower case 140, thereby making it possible to provide a space therebetween.

Additionally, the coupling end 141 is provided with a guide groove 142, thereby providing a path capable of penetrating through the FPCB 300. This allows the FPCB 300 to penetrate through a part of the piezoelectric vibration module 1 and to be extended to the outside while not being in contact with other configuration members.

Unlike this, the lower plate 121 may be coupled and fixed to both end portions of the lower case 140 by a step part (not shown) protruded in a vertical and downward direction at both end portions thereof.

Optionally, an upper portion of the weight body 130 is seated with one or more first buffering members 410, where the upper portion of the weight body 130 is disposed to face an inner side of the to upper surface of the upper case 110.

Since direct impact force is delivered to the vibration plate 120 including the piezoelectric element 200 at the time of external impact, for example, a drop of the piezoelectric vibration module 1 or a collision with an internal configuration member according to an increase in driving displacement of the piezoelectric element 200, the first buffering member 410 may prevent damage to the piezoelectric element 200 in advance.

Moreover, the piezoelectric vibration module 1 according to the preferred embodiment of the present invention includes a second buffering member 430 below both sides of the weight body 130, where the second buffering member 430 may prevent direct contact between the weight body 130 and the lower plate 121.

Additionally, the piezoelectric vibration module 1 according to the preferred embodiment of the present invention includes a third buffering member 440 on the center portion of the lower case 140, thereby preventing direct contact between the lower plate 121 and the lower case 140 by means of the third buffering member 440.

Optionally, the first buffering member 410, the second buffering member 430, and the third buffering member 440 may be made of a rubber material, but are not limited thereto and may be manufactured by various materials.

According to the preferred embodiment of the present invention, the present invention provides the piezoelectric vibration module capable of improving the adhesion between the external electrode of the piezoelectric element and the piezoelectric element, thereby making it possible to minimize the separation caused by the delamination phenomenon between the piezoelectric element and the external electrode under the expansion and contraction deformation of the piezoelectric element applied with the current from the flexible printed circuit board.

The present invention may obtain the above-mentioned effect only by simply adding the filler to the external electrode of the piezoelectric element without requiring the separate configuration member in order to prevent the delamination phenomenon as described above.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A piezoelectric vibration module comprising:
a piezoelectric element including printed patterns of a first internal electrode and a second internal electrode therein and having a first external electrode and a second external electrode formed on an external surface thereof, the first external electrode being electrically connected to the first internal electrode, and the second external electrode being electrically connected to the second internal electrode,
wherein the first external electrode and the second external electrode are made of silver (Ag) and are formed on the external surface of the piezoelectric element, and
wherein the first external electrode and the second external electrode additionally contain filler in silver (Ag).

2. The piezoelectric vibration module as set forth in claim 1, wherein the filler is made of a metal selected from a group consisting of copper (Cu), palladium (Pd), and a combination thereof.

3. The piezoelectric vibration module as set forth in claim 1, further comprising:
the piezoelectric element generating vibration force by repeatedly performing expansion and compression deformation by external power applied thereto;
an upper case opening a lower surface thereof and forming an internal space;
a lower case coupled to the lower surface of the upper case to shield the internal space of the upper case;
a vibration plate including a flat lower plate having the piezoelectric element mounted thereon and a pair of upper plates standing in a vertical upward direction at the center of both sides of the lower plate, and disposed in the upper case and the lower case to be vertically driven; and
a flexible printed circuit board having one side end portion contacting the piezoelectric element and the other side end portion drawn to the outside of the piezoelectric vibration module.

4. The piezoelectric vibration module as set forth in claim 3, wherein the vibration plate has a weight body additionally disposed between the pair of upper plates in order to increase the vibration force of the piezoelectric element.

5. The piezoelectric vibration module as set forth in claim 4, further comprising a second buffering member below both sides of the weight body.

6. The piezoelectric vibration module as set forth in claim 3, wherein the lower, case and the lower plate are spaced apart from each other by a predetermined interval.

7. The piezoelectric vibration module as set forth in claim 3, further comprising a first buffering member between the vibration plate and the upper case.

8. The piezoelectric vibration module as set forth in claim 3, further comprising a third buffering member between the vibration plate and the lower case.

9. The piezoelectric vibration module as set forth in claim 3, wherein the flexible printed circuit board (FPCB) has terminals so as to apply power to the first and second external electrodes of the piezoelectric element.

10. The piezoelectric vibration module as set forth in claim 9, wherein the first external electrode and the second external electrode are electrically connected to the respective terminals of the flexible printed circuit board through soldering parts.

11. The piezoelectric vibration module as set forth in claim 3, wherein the lower case has coupling ends protruded in a vertical upward direction at both end portions thereof.

12. The piezoelectric vibration module as set forth in claim 11, wherein the coupling ends form a guide groove.

* * * * *